US005492481A

United States Patent [19]
Lewis

[11] Patent Number: 5,492,481
[45] Date of Patent: Feb. 20, 1996

[54] CIRCUIT CARD INTERFACE SYSTEM

[75] Inventor: Mark E. Lewis, Mansfield, Mass.

[73] Assignee: Augat Inc., Mansfield, Mass.

[21] Appl. No.: 237,551

[22] Filed: May 3, 1994

Related U.S. Application Data

[63] Continuation-in-part of Ser. No. 20,772, Feb. 22, 1993, Pat. No. 5,334,046.

[51] Int. Cl.$^6$ .................................................. H01R 13/635
[52] U.S. Cl. ............................ 439/159; 361/754; 436/64
[58] Field of Search ........................... 439/64, 152, 159, 439/160, 153, 155; 361/754, 798

[56]  References Cited

U.S. PATENT DOCUMENTS

| | | | |
|---|---|---|---|
| D. 320,003 | 9/1991 | Komatsu | D13/147 |
| D. 322,604 | 12/1991 | Komatsu | D14/114 |
| D. 336,746 | 6/1993 | Tse | D14/100 |
| 4,858,070 | 8/1989 | Buron et al. | 361/384 |
| 4,868,713 | 9/1989 | Banjo et al. | 361/392 |
| 4,887,188 | 12/1989 | Yoshida et al. | 361/413 |
| 4,889,495 | 12/1989 | Kimura | 439/60 |
| 4,914,552 | 4/1990 | Keemer | 361/415 |
| 4,915,636 | 4/1990 | Knight | 439/65 |
| 4,919,626 | 4/1990 | Anhalt et al. | 439/260 |
| 4,924,076 | 5/1990 | Kitamura | 235/492 |
| 4,941,841 | 7/1990 | Darden et al. | 439/377 |
| 4,952,161 | 8/1990 | Komatsu | 439/155 |
| 4,961,710 | 10/1990 | Komatsu | 439/267 |
| 4,996,631 | 2/1991 | Freehauf | 361/415 |
| 5,051,101 | 9/1991 | Komatsu | 439/159 |
| 5,080,609 | 1/1992 | Fabian et al. | 439/540 |
| 5,085,590 | 2/1992 | Galloway | 439/95 |
| 5,092,799 | 3/1992 | Kimura | 439/924 |
| 5,113,317 | 5/1992 | Howe | 361/413 |
| 5,145,397 | 9/1992 | Yamada et al. | 439/328 |
| 5,151,847 | 9/1992 | Rautenberg | 361/395 |
| 5,161,989 | 11/1992 | Okubo et al. | 439/159 |
| 5,176,523 | 1/1993 | Lai | 439/64 |
| 5,389,001 | 2/1995 | Broschard, III | 439/159 |

OTHER PUBLICATIONS

"PCMCIA" Personal Computer Memory Card International Association, PC Card Standard, Release 2.0 Booklet, Sep. 1991.

Primary Examiner—Neil Abrams
Attorney, Agent, or Firm—Weingarten, Schurgin, Gagnebin & Hayes

[57] ABSTRACT

A circuit card interface system of minimized vertical clearance, capable of interfacing one or more circuit cards to a relatively small space on a mother board. The interface system includes an interfacing connector assembly and at least one stacking connector assembly, each adapted to receive a circuit card. The conductors of the interfacing connector assembly are coupled to a substrate such as a mother board. The interfacing connector assembly can be used alone or with one or more electrically interconnected stacking connector assemblies. Rapid electrical attachment of each stacking connector assembly is accomplished by mating a cooperating portion of the stacking connector assembly with a portion of the underlying interfacing connector assembly. A separable header connector assembly 204 is attachable to a metal frame 202 comprising rails for receiving the circuit card. The separable header is attached via a metal latch with an opening 224 that engages a plastic boss 222. A center mounted ejection lever mechanism facilitates removal of the installed circuit card. The ejection lever mechanism includes a reversible ejection lever 206 and push arm 210 which, in conjunction with symmetrical rails 212, 214, enables left or right hand mounting of the ejection lever.

12 Claims, 15 Drawing Sheets

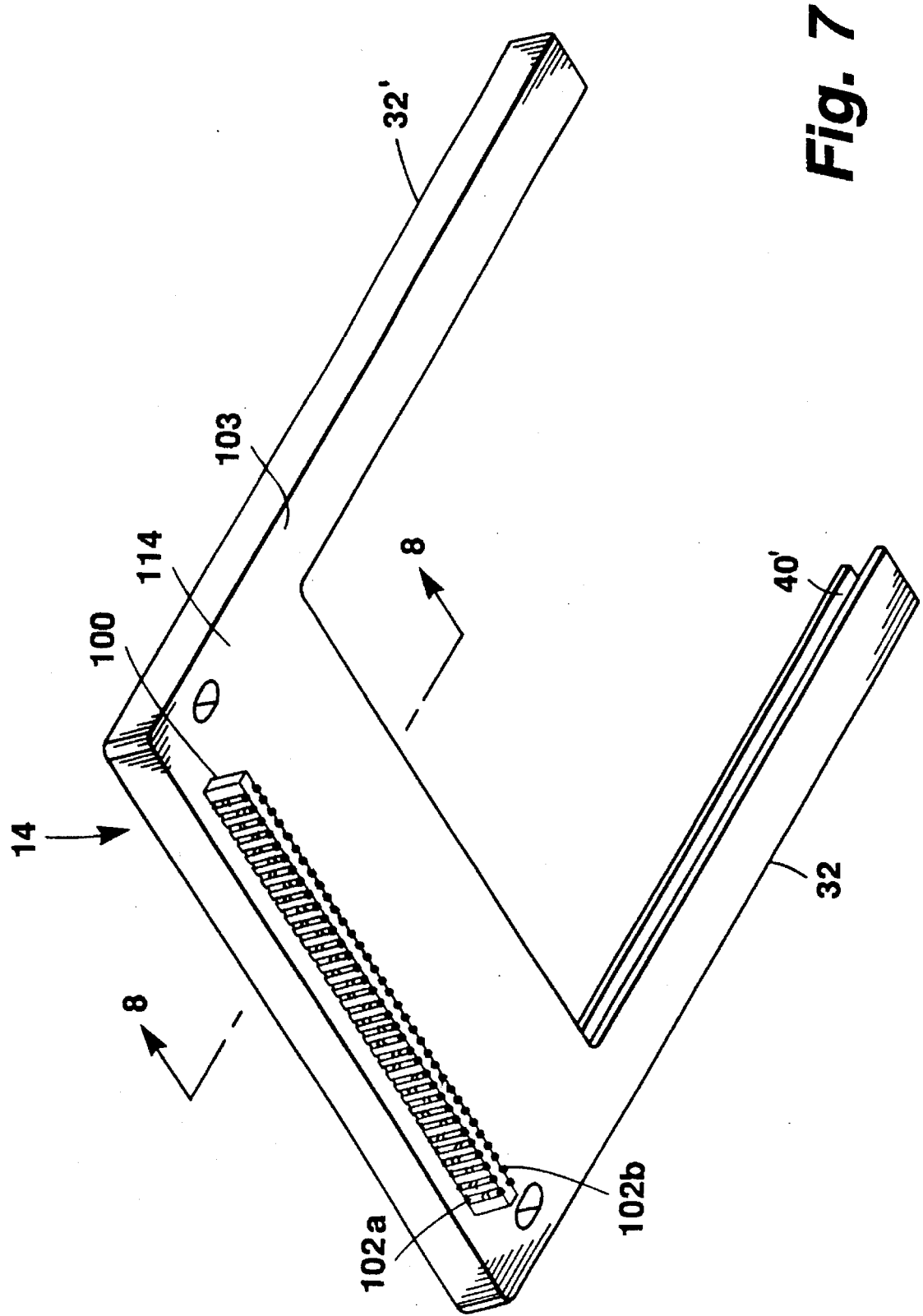

CIRCUIT CARD INTERFACE SYSTEM

RELATED APPLICATION

This application is a continuation-in-part of application Ser. No. 08/020,772 filed Feb. 22, 1993, now U.S. Pat. No. 5,334,046.

FIELD OF THE INVENTION

This invention relates generally to circuit board interface connectors, and more specifically to stackable circuit board interface connector assemblies.

BACKGROUND OF THE INVENTION

It is often desirable to install two or more electronic circuit boards in close proximity to each other in a relatively small area. For example, it may be desirable to place a pair of memory boards in close proximity to each other in order to minimize space utilization, while still providing discrete electrical signal paths to each circuit board. So-called card cages have been used in the past to minimize inter-board spacing. This approach, however, typically requires a bulky frame.

Furthermore, to provide the discrete electrical signal paths between a mother board and an edge connector of a circuit board, complex individual wiring is required. Such wiring has been provided by wires bundled in cables, or by ribbon cables. Such wiring arrangements are commonly subject to induced capacitive interference and cross-talk, forcing the addition of expensive and undesirable shielding and pull-down or pull-up circuits to stabilize signals or power carried in those wires. A further problem with such wiring arrangements is that the length of the conductors linking the mother board to the card cage connectors results in time delays and signal degradation.

Electrical connectors such as disclosed in U.S. Pat. No. 5,139,435 include asymmetrical rails and a card ejecting mechanism which comprises a swingable cam, pin connected to the connector body at either the end of the left or right side of the connector body. Such connectors are generally fabricated having a one piece frame made from insulating synthetic resin and having electrically conductive contact pins and terminals at a header end thereof. The contact pins at the header end project through the single piece insulative connector body to connect with a circuit card installed therein. The terminals extend beyond the header end of the single piece insulative connector body for interconnection with a circuit board or other substrate which is mated with the connector. Such single piece connector bodies are typically molded in complex molds and are not suitable, due to their relatively large size, for use with automatic assembly equipment (e.g. pick and place machines), when fabricated into electronic subassemblies. Furthermore, the asymmetry of the frame and the left or right end mounting of the cam/ejection mechanism requires that different molds be used in fabricating the left end and right end versions of the frame and ejection mechanisms. Additionally, such a cam/ejection mechanism, end mounted with no regard for symmetry, presents the likelihood of a card becoming skewed as it is removed, making removal more difficult due to the unevenness of forces applied to the card during removal.

U.S. Pat. No. 5,051,101 discloses a connector of the type for receiving and ejecting circuit cards, comprised of a separable header end with card interconnections and an ejection mechanism. The ejection mechanism is comprised of a lever (22) secured to a connecting piece (32) which connects to a guide (9) having portions that engage a circuit card being installed into or removed from the connector. The guide, among other things, serves to distribute the load of the card on the mechanisms facilitating insertion and removal. The guide in the illustrative embodiment of the '101 patent is an integrally formed molded piece of synthetic resin which includes a slider (8), engagement pieces (11), a bracket (15) and a boss (16). The guide co-acts with the operating lever which is rotatably attached by a pin offset from the center of a frame to which the ejection mechanism is attached. The offset nature of the operating lever likely creates unbalanced forces of a circuit card being installed, necessitating the force distribution function of the guide. The guide represents an additional molded or stamped part, which like other prior art connectors is not designed with regard to symmetry and results in inflexibility in fabrication and the need for additional costly tooling.

SUMMARY OF THE INVENTION

The present invention provides a circuit card interface system of minimized vertical clearance for mechanically and electrically connecting at least one circuit card to an associated substrate, such as a mother board.

According to one embodiment of the invention, the circuit card interface system includes an interfacing connector assembly and a stacking connector assembly, each adapted to receive a circuit card. Interfacing connector conductors are terminated in tails, surface mounted to a substrate, enabling higher conductor density. The interfacing connector assembly can be used alone or with one or more stacking connector assemblies. Rapid and simple electrical attachment of the interface and stacking connector assemblies is accomplished by mating cooperating interconnections.

The circuit cards to be connected can be PCMCIA (Personal Computer Memory Card International Association) standard PC memory cards, fax cards, I/O cards, or the like. Signal paths for each circuit card are minimized in length and spaced apart by insulators, substantially reducing electrical interference and propagation delays.

Features of the invention include provision of a connector arrangement in which electrical and mechanical interference and propagation delay between the circuit cards is minimized. The connector arrangement facilitates a minimized connector footprint and reduced space consumption on a substrate or mother board. The connector arrangement also can include an open connector configuration for circuit card probing and ventilation.

In another embodiment, a circuit card interface is provided having a separable or detachable header with electrical contacts disposed therein. The separable header can be processed by automated pick and place equipment to facilitate greater automated assembly of subassemblies having a connector according to the invention. The separable header is removably attached to a metallic frame incorporating rails for receiving a circuit card and an ejection mechanism for ejecting the card from the connector. The frame is stamped metal which is symmetrical for receiving a left or right hand oriented ejection mechanism. The ejection mechanism is comprised of a centrally mounted ejection lever and a side mounted push arm. The ejection lever can be either left or right side mounted, for receipt of the push arm, effecting a two piece ejection mechanism which directly engages the circuit card, eliminating the need for force distribution members, and minimizes circuit card skew upon ejection.

DESCRIPTION OF THE DRAWINGS

These and other features and advantages of the present invention will be better understood by reading the following detailed description, taken together with the drawings wherein:

FIG. 7 is a bottom perspective view of a stacking connector assembly according to the invention;

FIG. 9b is an exploded view of the dual stackable connector of FIG. 9a;

FIG. 10b is an exploded view of the single connector implementation of FIG. 10a;

FIG. 11a is an exploded view of a frame and ejector mechanism of the connector of FIG. 10a; and FIG. 11b is a perspective view of an eject lever and push arm of the ejector mechanism of FIG. 11a.

DETAILED DESCRIPTION

Figure 1:
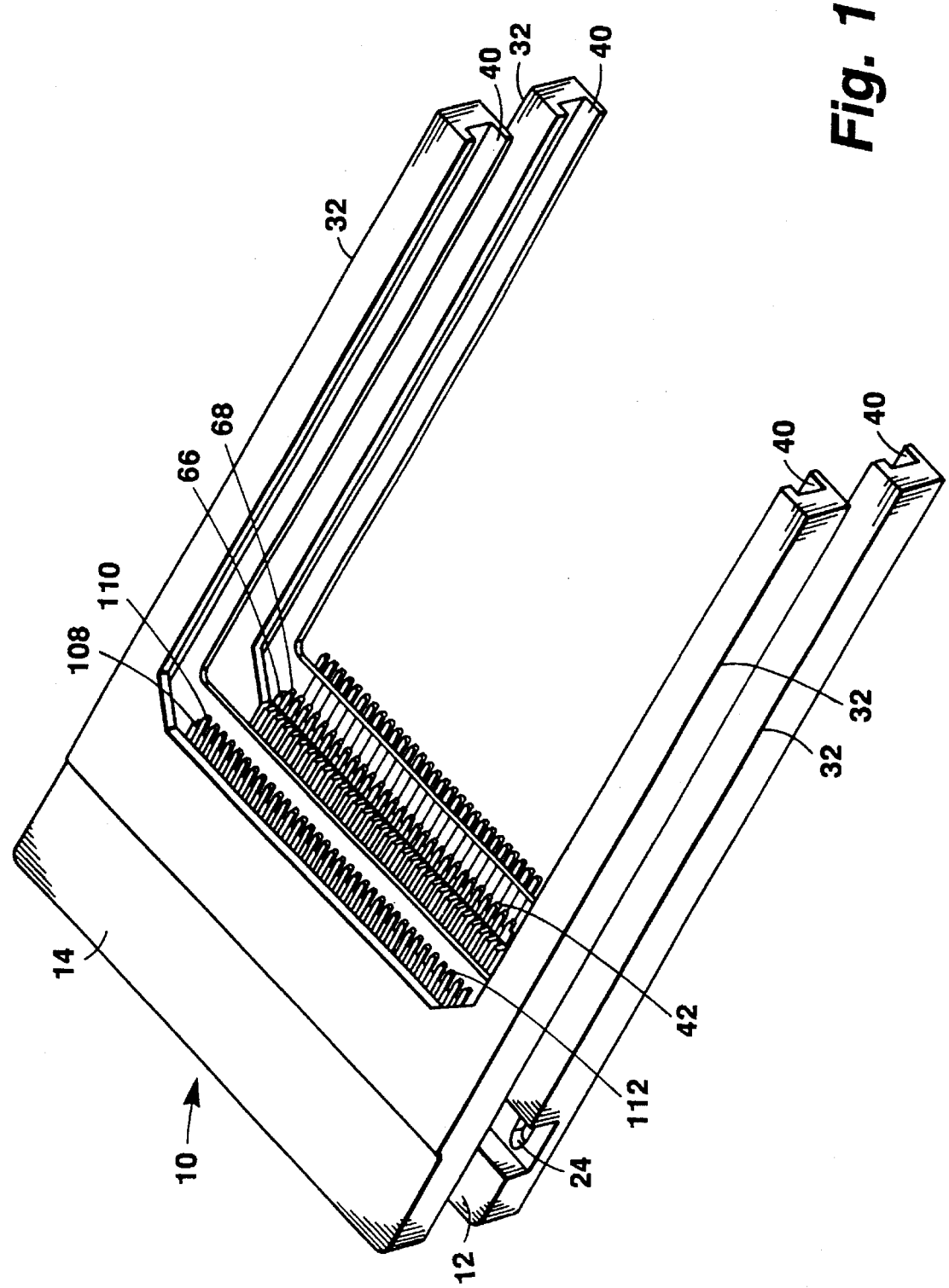
FIG. 1 is a top perspective view of a circuit card interface system according to the invention.

Referring now to FIG. 1, a circuit card interface system 10 includes an interfacing connector assembly 12 and a stacking connector assembly 14. In an exemplary embodiment, the circuit card interface system 10 is mechanically mounted on a mother board (not illustrated) by fasteners such as socket head screws (not illustrated) which pass through screw holes 24 into the mother board.

Figure 2:
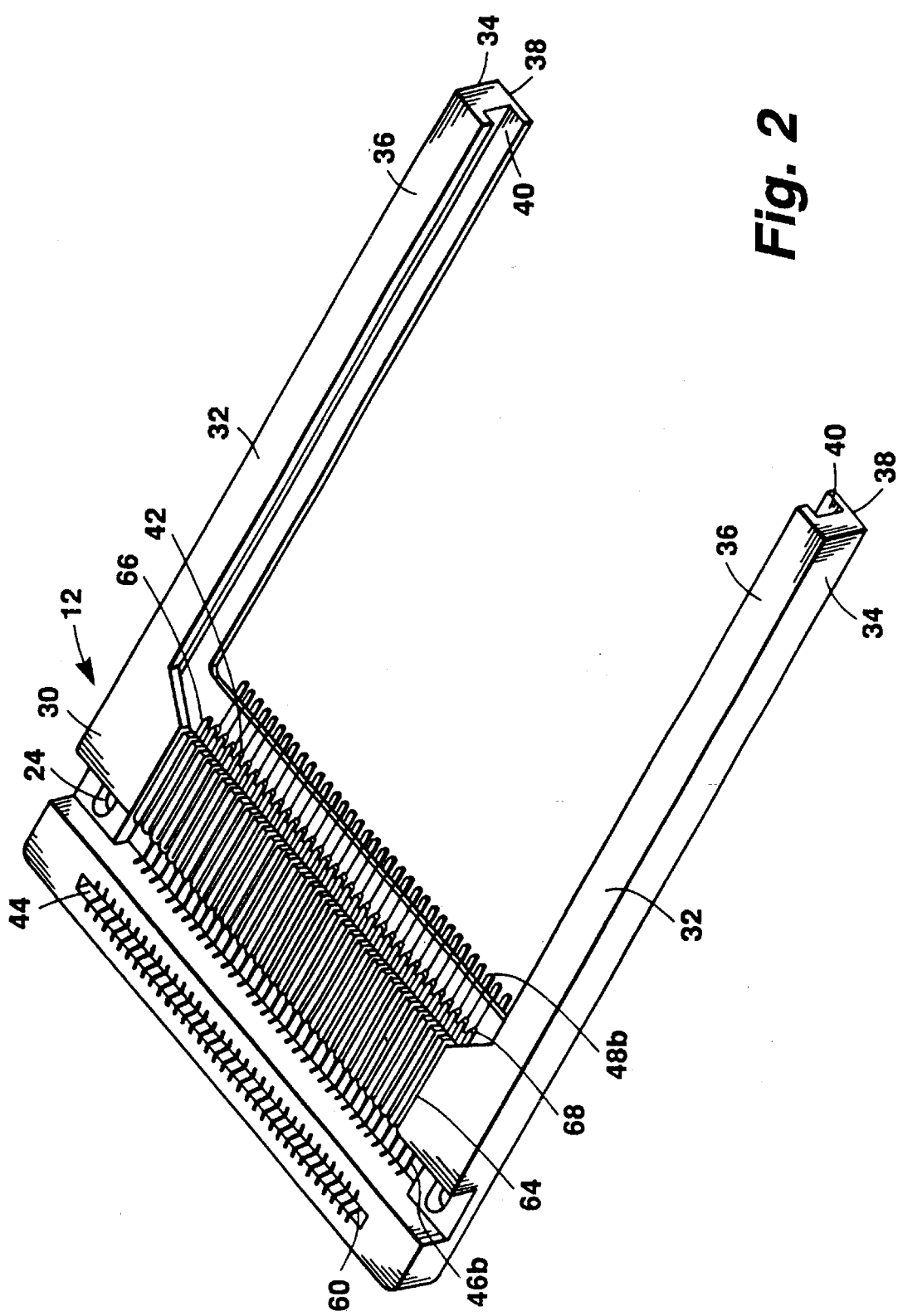
FIG. 2 is a top perspective view of an interfacing connector assembly according to the invention.

The interfacing connector assembly 12, as illustrated in FIG. 2, has a substantially U-shaped frame 30. The frame is fabricated, for example, from any of various light weight, resilient, and insulative materials such as plastic. The frame 30 includes two card guide members 32. Each of the card guide members 32 has a side wall 34, an upper surface 36 and a lower surface 38. In the illustrative embodiment, a card guide channel 40 is formed between the upper and lower surfaces 36, 38 and into an interior surface of the respective side walls 34. The card guide channel 40 is dimensioned to receive removable circuit cards such as PCMCIA cards Type I (90a) and Type II (90b), illustrated in FIGS. 3a and 3b, respectively, and described in PCMCIA PC Card Standard Release 2.0, or Type III cards described in subsequent releases of the PCMCIA Card Standard, which are incorporated herein by reference. The card guide channel 40 is configured to allow circuit cards to slide freely therein and to maintain alignment of the circuit card with contacts of the interfacing connector assembly, as the card is being inserted in the interfacing connector assembly 12.

Figure 4:
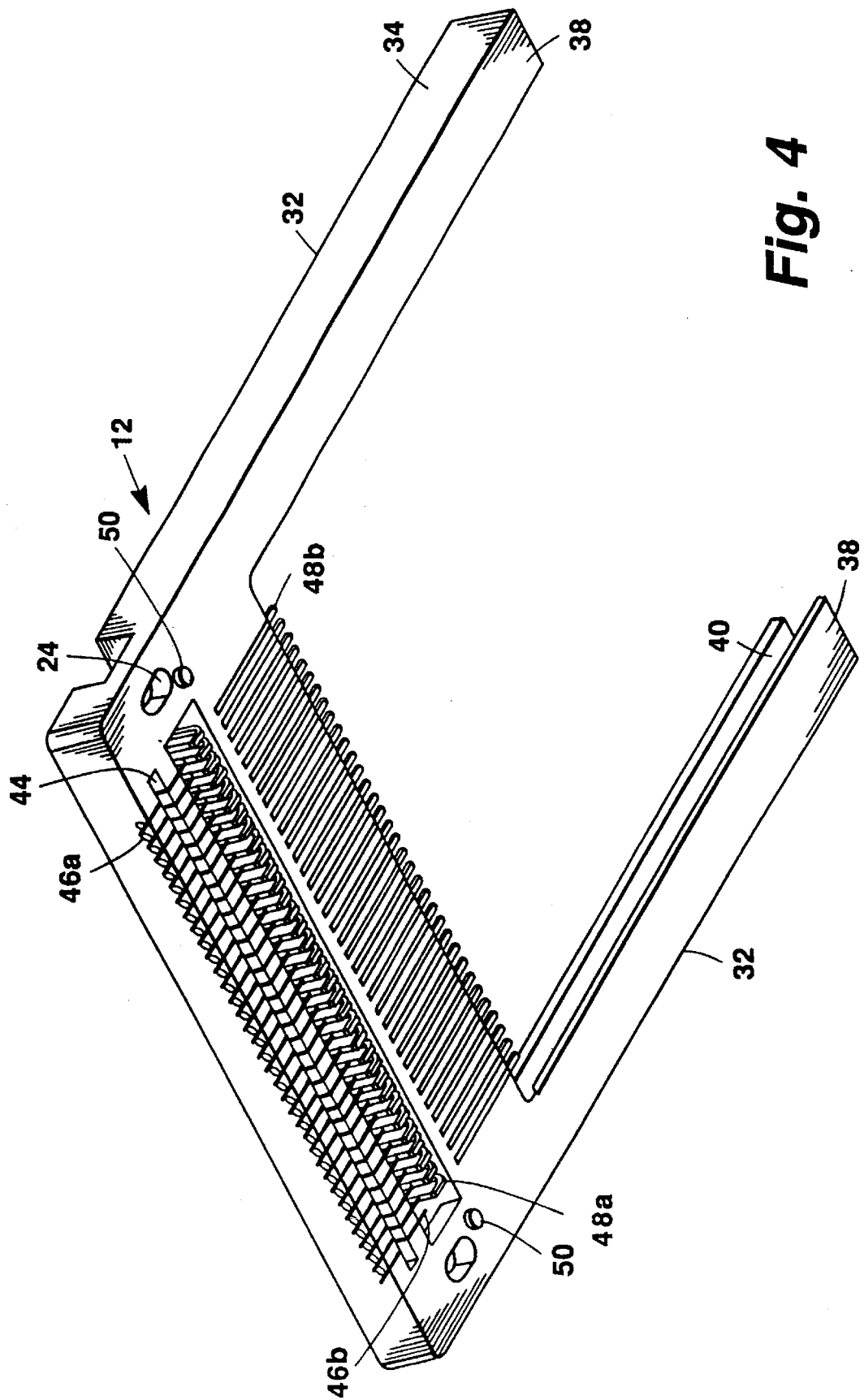
FIG. 4 is a bottom perspective view of the interfacing connector assembly of FIG. 2.

In the illustrative embodiment of FIGS. 1 and 2, electrical connection between the interfacing connector assembly 12 and the stacking connector assembly 14 is facilitated by a card edge style connector receptacle 44, located in a forward end of the interfacing connector assembly 12. As illustrated in FIG. 4, which depicts an underside or board mounting side of the interfacing connector assembly 12, the card edge receptacle 44 includes a plurality of forward surface mount leads 46a, 46b. The forward surface mount leads 46a, 46b provide electrical signal paths between conductors on a stacking connector assembly 14 electrically interconnected with the interfacing connector assembly 12, as discussed hereinafter, and electrical interconnections on a substrate or mother board (not illustrated).

A plurality of rearward surface mount leads 48a, 48b provide electrical signal paths for interconnection between a circuit card mated with contacts of a card mating connector 42 of the interfacing connector assembly 12 (best seen in FIG. 2), and electrical interconnections on the mother board. The underside of the interfacing connector assembly also includes positioning elements or alignment posts 50 which extend from the bottom surface of the interfacing connector assembly 12 and which mate with associated indentations in the mother board (not illustrated), to ensure proper alignment between the surface mount leads on the interfacing connector assembly 12 and electrical interconnections on the mother board.

Figure 5:
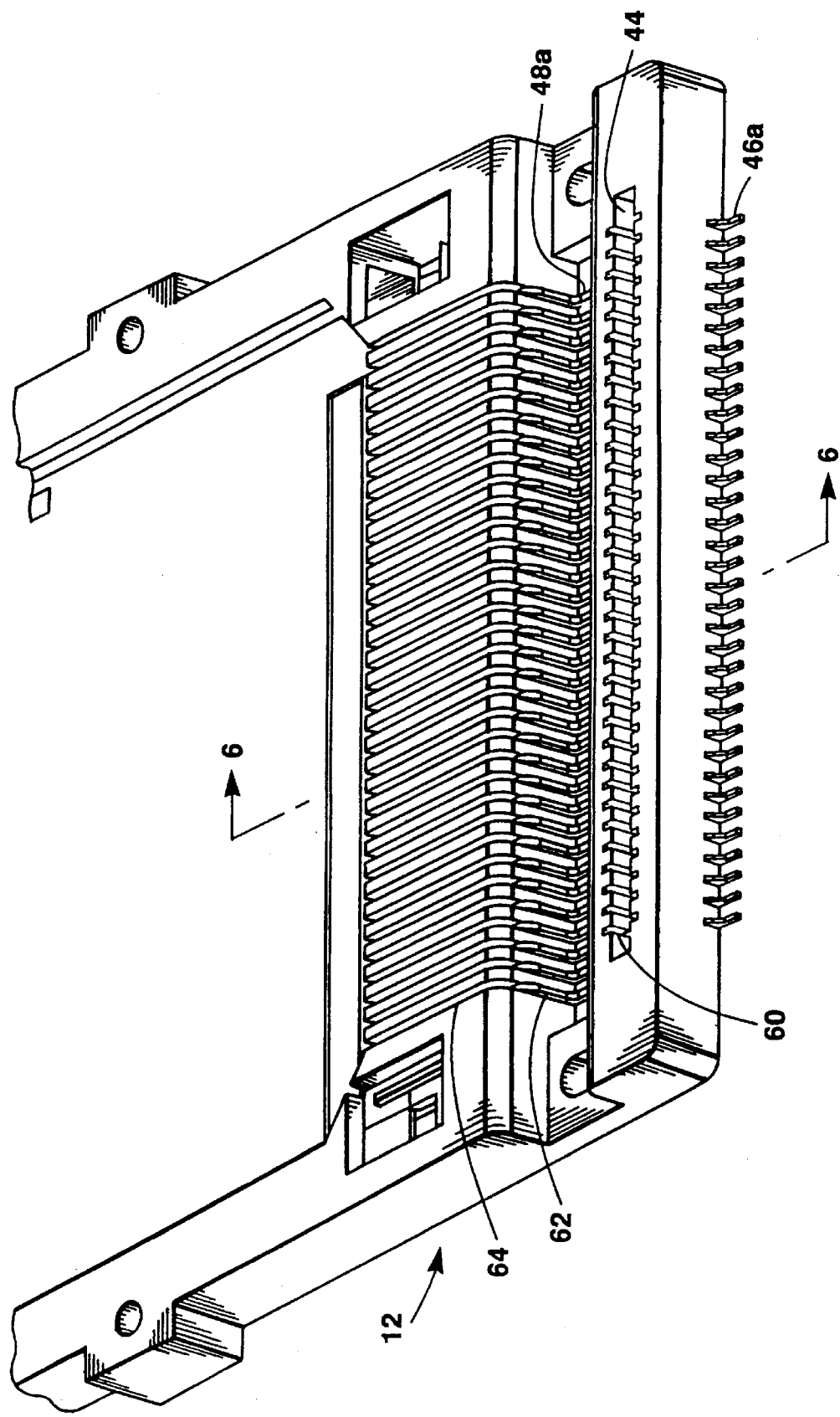
FIG. 5 is a top perspective view of a forward portion of the interfacing connector assembly of FIG. 2.
Figure 6:
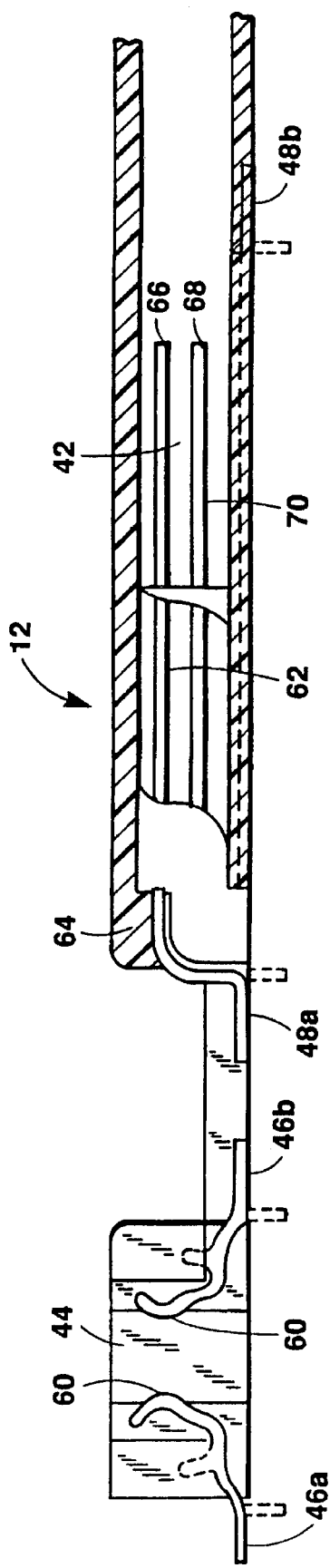
FIG. 6 is a side section view of the forward portion of the interfacing connector assembly of FIG. 5 taken along lines 6—6 of FIG. 5.

FIGS. 4–6 best illustrate the positioning and configuration of the forward surface mount leads 46a, 46b, relative to the card edge connector receptacle 44 of the interface connector 12, and associated electrical contacts located therein. In the illustrative embodiment, the electrical contacts associated with respective surface mount leads 46a, 46b are disposed within the connector receptacle to receive and electrically engage an interface portion of the stacking connector assembly 14, described hereinafter, and to facilitate electrical interconnection between the stacking connector assembly 14 and the substrate or motherboard.

Rearward surface mount leads 48a, 48b, of the interfacing connector assembly 12 illustrated in FIGS. 4–6, are configured including an upper row of conductors 62. The upper row of conductors 62 are installed in a plurality of slots 64 accessible on a surface of the interface assembly 12 and terminate in the card mating connector portion 42 as a plurality of interfacing connector assembly upper row pins 66.

A plurality of interfacing connector assembly lower row pins 68 are also illustrated in FIGS. 4–6, in the card mating connector portion 42. The lower row pins 68 terminate at an end as the rearward surface mount leads 48b and have a plurality of interfacing connector assembly lower row conductors 70 disposed therebetween. The lower row of conductors 70, like the upper row of conductors 62, are engaged within slots of the interface assembly 12 dimensioned to maintain the conductors therein, via interference fit. It should be appreciated that respective pins, leads and conductors can be implemented as discrete or unitary electrically conductive elements. Furthermore, as illustrated by dotted lines descending from the leads in FIG. 6, it should be appreciated that although surface mount leads are illustrated and discussed, the leads 46a, 46b, 48a, 48b can project orthogonally from the underside of the interface connector 12 and be implemented for through-hole application.

Figure 8:
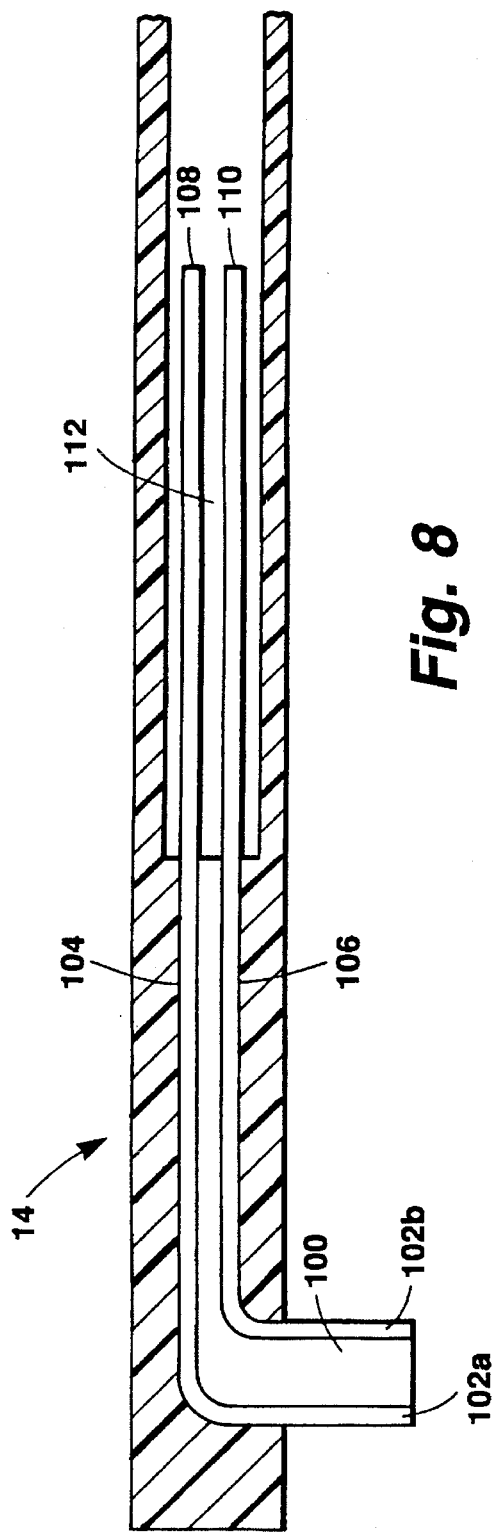
FIG. 8 is a side section view taken along lines 8—8 of FIG. 7.

As illustrated in FIGS. 7 and 8, a stacking connector assembly 14, like the interfacing connector assembly 12, includes a substantially U-shaped frame 114, card guide members 32' and card guide channels 40' formed therein. The stacking connector assembly 14 further includes a card edge style interface portion 100 located on a lower surface 103 of the stacking connector assembly 14 and a pin connector portion 112 located interior to the U-shaped frame 114. The pin connector portion 112 engages a circuit card disposed within the card guide channels 40'. The interface portion 100 of the stacking connector assembly 14, mechanically and electrically engages the card edge style interface receptacle 44 of the interfacing connector assembly 12 discussed hereinbefore.

Figure 3:
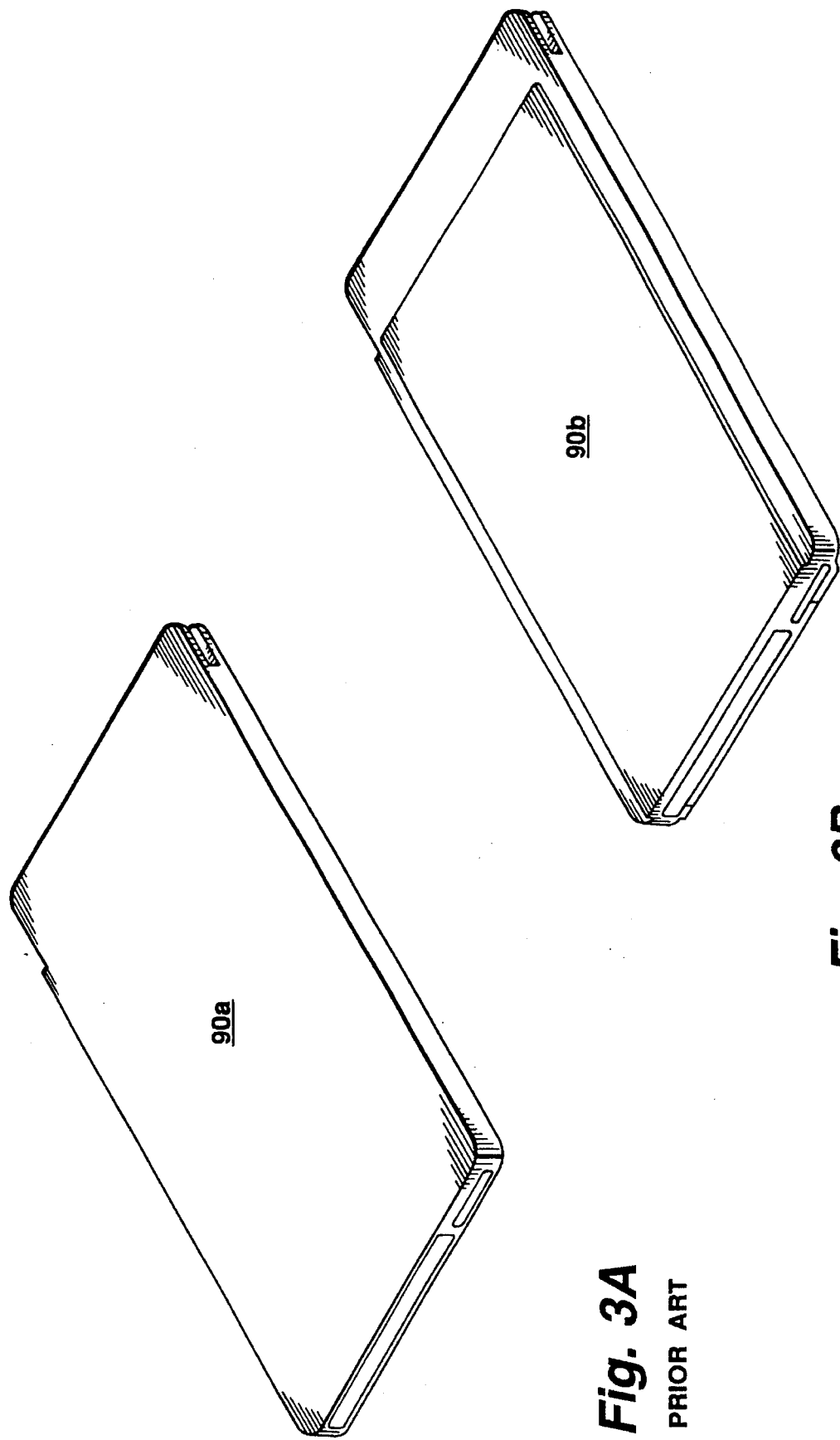
FIGS. 3a and 3b are top perspective views of a Personal Computer Memory Card International Association (PCMCIA) Type I PC card, and PCMCIA Type II PC card, respectively, according to the prior art.

The interface portion 100 includes a plurality of right angle pins 102a, 102b which are substantially equidistantly spaced along two outer sides of the interface portion 100. The pins 102a, 102b are one end of upper and lower row conductors 104, 106 (FIG. 8). The other end of the upper and lower row conductors 104, 106 are upper and lower row connector pins 108, 110 forming the pin connector portion 112, disposed to electrically connect a circuit card, such as illustrated in FIGS. 3a and 3b, to the stacking connector assembly 14. The upper and lower row conductors 104, 106 and associated pins 102a, 102b, 108, 110 are interference fit into the stacking connector assembly 14 and can be comb loaded into slots via an exterior surface of the assembly 14, or otherwise disposed therein.

Referring now to FIG. 1, an interfacing connector assembly 12 and a stacking connector assembly 14, which comprise a circuit card interface system 10, are illustrated in position for electrical and mechanical mating. The pins 102a, 102b of the interface portion 100 of the stacking connector assembly 14 mechanically and electrically engage the electrical contacts 60 of the interface receptacle 44 of the interfacing connector assembly 12 when the stacking and interface connector assemblies 14, 12 are mated together by inserting the interface portion 100 of the stacking connector assembly 14 into the interface receptacle 44 of the interfacing connector assembly 12.

The interfacing and stacking connector assemblies 12, 14 have substantially similar card mating connectors 42, 112 for providing an electrical interface to removable circuit cards such as PCMCIA Type I, Type II, or Type III cards. The appropriate circuit cards are disposed within the card guide channels 40 formed in the two card guide members 32 on both connector assemblies 12, 14.

The interfacing connector assembly 12 is electrically connected, such as by solder attachment, with electrical interconnections on the substrate or mother board. With the stacking connector assembly electrically connected with the interfacing connector assembly, the circuitry of an upper circuit card installed in the stacking connector assembly 14 is electrically coupled with electrical interconnections on the substrate or mother board via the upper and lower row conductors 104, 106. The upper and lower row conductors 104, 106 electrically contact the upper circuit card through associated upper and lower row pins 108, 110, which engage the interface connector assembly 12 at the interface receptacle 44 via right angle pins 102a, 102b, which interconnect with the contacts 60 that have surface mount leads 46a, 46b soldered to the electrical interconnections on the mother board.

The circuitry of a lower circuit card installed in the interface connector assembly 12 is electrically engagable with electrical interconnections on the substrate or mother board, via the upper and lower row pins 66, 68. The upper and lower row pins 66, 68 in electrical engagement with the lower circuit card, electrically engage the mother board interconnects via surface mount leads 48a, 48b soldered thereto.

While the interfacing connector assembly and stacking connector assembly are described and illustrated having "card edge style" receptacle(s) and interface portions, respectively, it will be appreciated that alternative interconnection mechanisms can be implemented for mechanically and electrically interconnecting the stacking connector assembly to the interfacing connector assembly. Individual pins and sockets, fingers and associated receptacles, IDS receptacles and short wiring, and DIN style interconnects are only a few examples of alternative interconnection mechanisms that may be implemented.

Although the present invention is described illustratively implementing two connector assemblies stacked, it will be appreciated that the interfacing connector assembly can be modified to include a plurality of stacking connector receptacles (44) to accommodate a plurality of stacking connector assemblies.

Additionally, although the illustrative embodiment(s) described herein have pluralities of surface mount leads configured on the interfacing connector assembly, it should be appreciated that the leads for electrically interconnecting the interfacing connector assembly with the substrate or motherboard can be leads other than surface mount, such as through hole or compression type leads or the like, or combinations thereof.

Furthermore, while the underside of the interfacing connector assembly is described as having alignment posts for aligning the connector(s) with a footprint on a substrate, it will be appreciated that alternative alignment means, such as through holes and pins, and/or various types of hardware or the like can be implemented.

While the interfacing and stacking connector assemblies described herein have a substantially U-shaped circuit card receiving portion including two card guide members dimensioned for receiving PCMCIA standard cards, it will be appreciated that the card receiving portion can be alternatively constructed and dimensioned to receive nonstandard cards, and can be constructed with card guide members in excess of two.

Additionally, although the interfacing and stacking connector assemblies are described as having similar card mating connector portions including pins for engaging PCMCIA cards, it should be appreciated that the assemblies can be alternatively implemented, such as having female receptacles for receiving male interconnects on installable cards or having compression type contacts engagable with mating contacts on the mating card(s).

It should be clear from the foregoing that in other embodiments the present invention can be used to interface a wide array of circuit board mounted electronics such as memory cards, I/O cards, card mounted floppy and optical disk drives, microprocessors, and math co-processors, as well as other application specific or specialized use circuitry. In order to accommodate such varied electronics, the card guide channels 40 and interconnects on each connector assembly 12, 14 need not be identical.

In an alternative embodiment illustrated in FIGS. 9a–11b, a dual stackable, surface mountable connector has a removable header which can be separately processed during subassembly fabrication by automated assembly machinery. The dual stackable connector 200 includes a top connector assembly 201 and a bottom connector assembly 201'. Each connector assembly in the dual stackable connector 200, illustrated in FIG. 9a, includes a metallic frame 202, 202' to which is attached the removable header 204, 204'. In the dual stacked embodiment, as discussed in detail hereinafter, two frames 202, 202' are vertically stacked. Each frame has associated therewith an ejection mechanism comprised of an ejection lever 206, 206' (best seen in FIG. 11a) movably mounted via a center mount 208, 208'. Each ejection lever 206, 206' is actuated by a push arm 210, 210'. In the stacked embodiment illustrated in FIG. 9a, an upper frame 202 push arm 210 is left side mounted and a lower frame 202' push arm 210' is right side mounted.

Figure 9A:
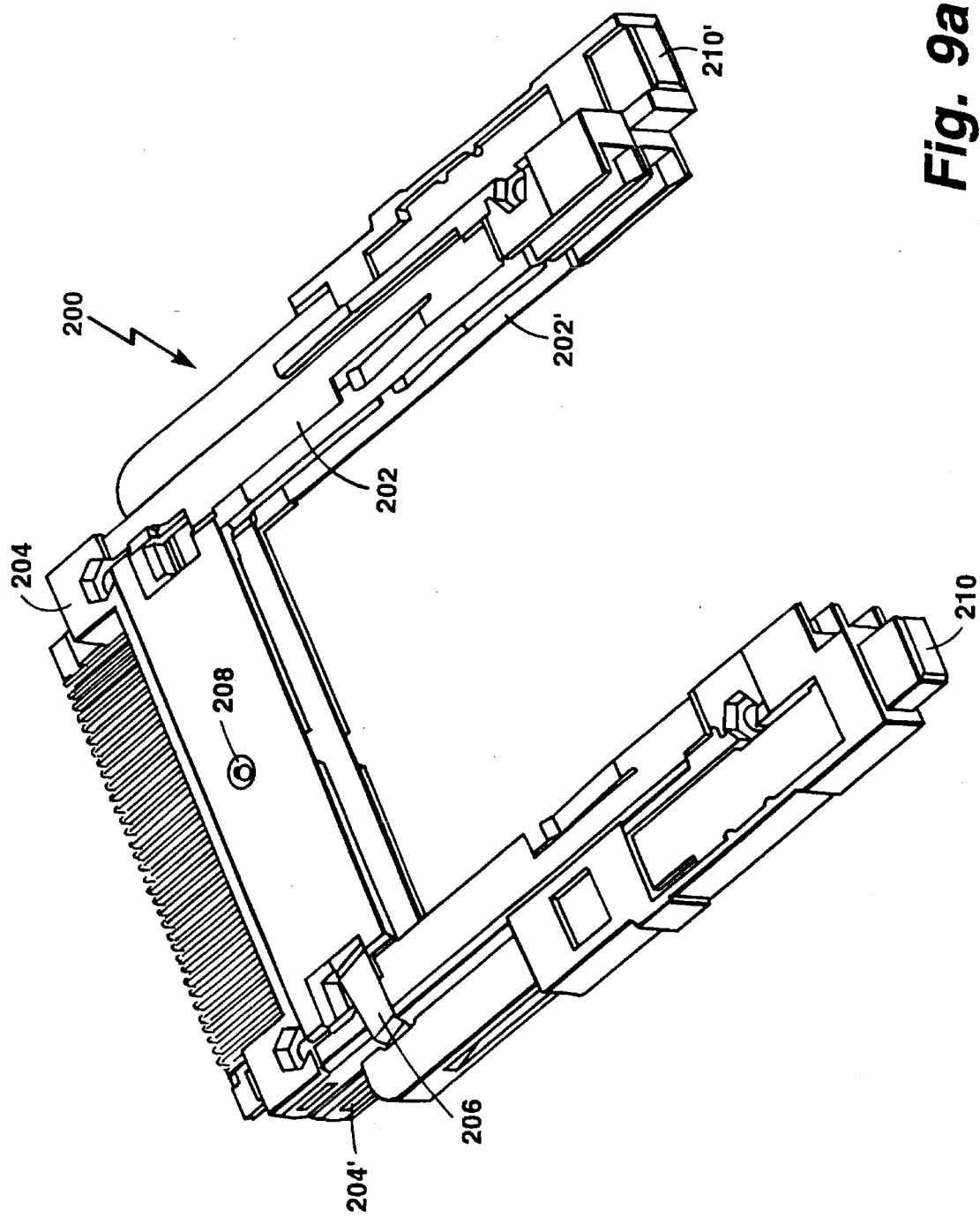
FIG. 9a is a perspective view of a dual stackable connector according to another embodiment, having a removable header.
Figure 9B:
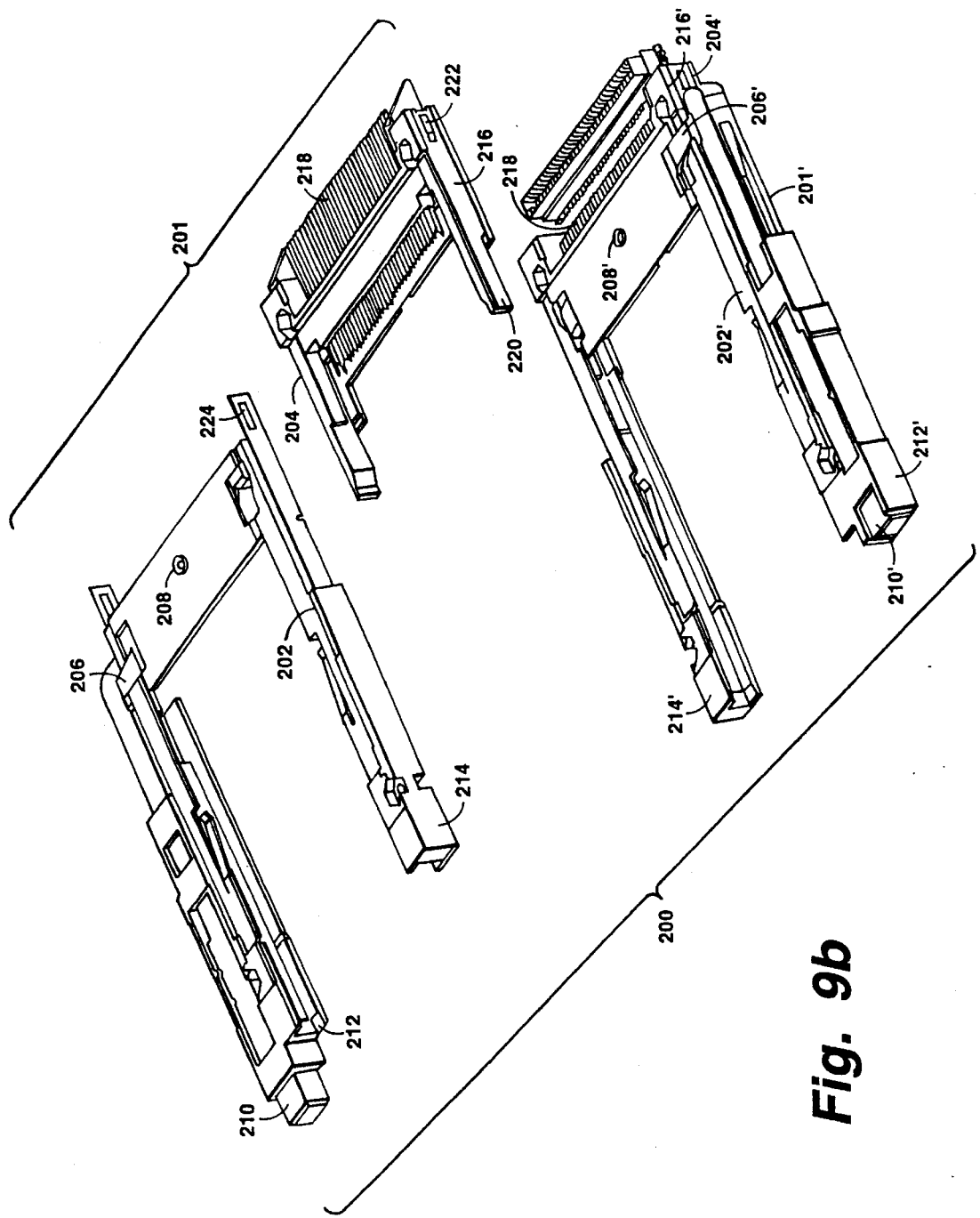
Figure 9C:
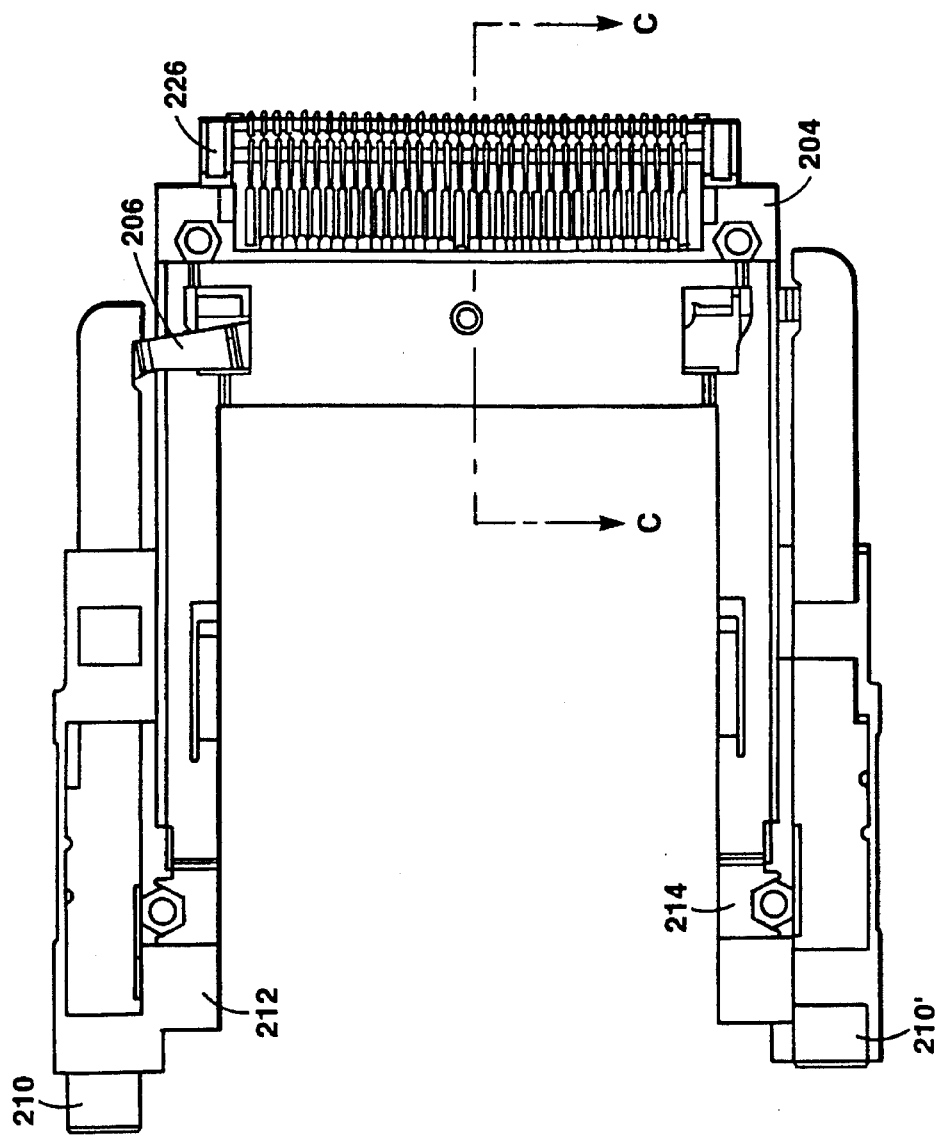
FIG. 9c is a plan view of the dual stackable connector of FIGS. 9a and 9b.
Figure 9D:
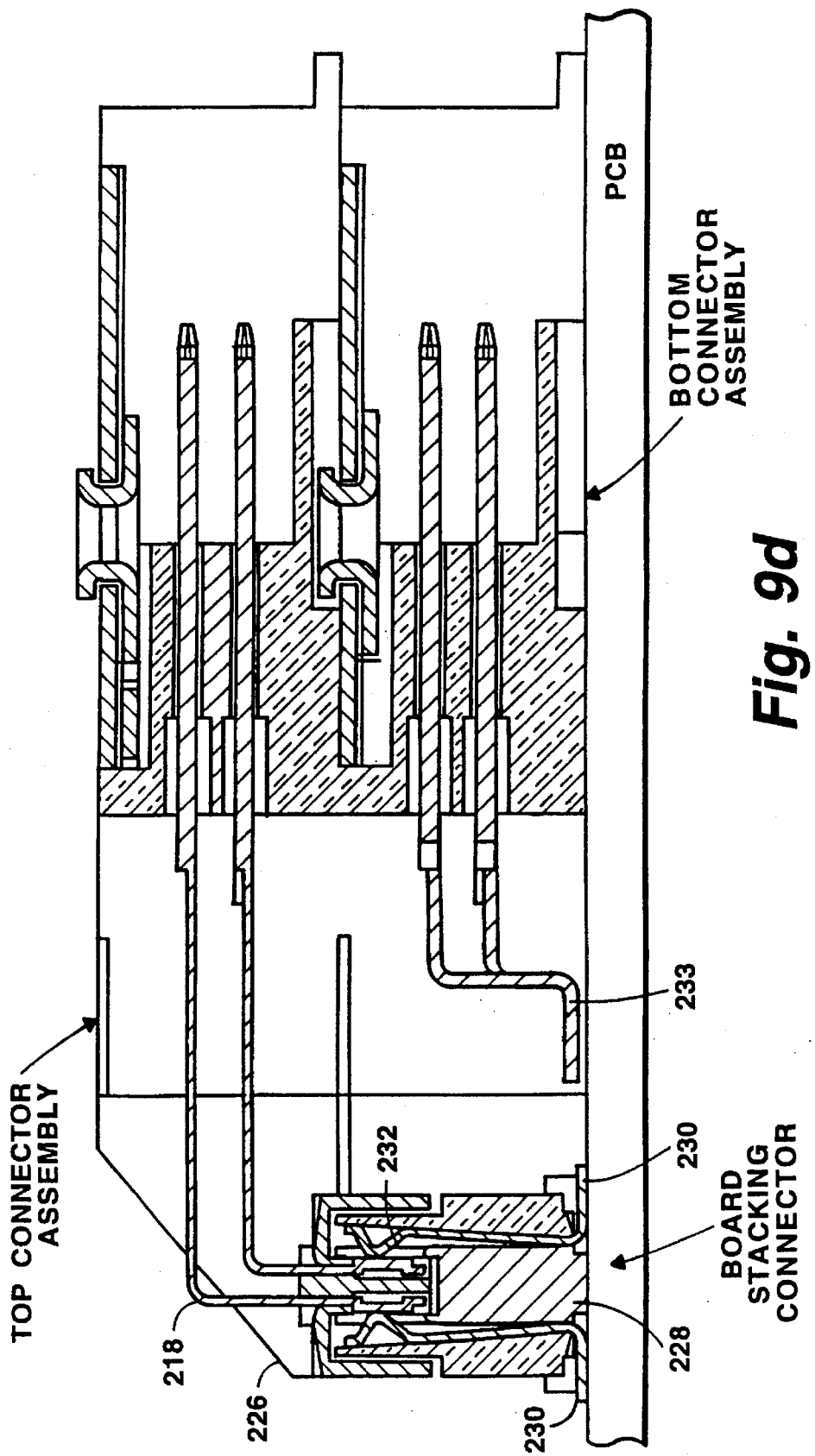
FIG. 9d is a sectional view of the dual stackable connector taken along line c—c of FIG. 9c.

Referring now to FIGS. 9b–9d, each push and 210, 210' is configured to be installed in an ejection rail 212, 212' which slidably receives the push arm 210, 210' and provides a guide for sliding movement thereof. A straight rail 214, 214' is disposed opposite the ejection rail 212, 212'. The ejection rail(s) 212, 212' and straight rail(s) 214, 214' snap fit into the frame component 202, 202' (see FIG. 11a), such that rail portions thereof are disposed facing each other and in alignment with rail portions of the frame. The rail portions of the straight rail 214, 214', ejection rail 212, 212' and frame 202, 202' slidably receive a circuit card (such as the PCMCIA card illustrated in FIG. 10a). The push arm, straight rail and ejection rail components are symmetrical, so that such components can be used on either the left or right side of the frame, minimizing tooling and costs associated with fabricating connectors according to the invention.

The removable header portion 204, 204' of the bottom connector assembly 201' and top connector assembly 201 includes a header frame 216, 216' formed of an insulative material. The header frame 216, 216' has upper and lower contacts 218, friction fit in rows therein. Header frame rails 220 disposed on either side of the header frame are configured with engagement features, such as a boss or protuberance 222, for removably engaging and retaining corresponding receptacle features 224 on the metallic frame 202, 202'. The metal frame/insulative header frame combination provides the advantages of having a metal portion engaging the circuit card to permit electrostatic discharge removal, while having the strength of the metallic frame and insulative properties of the insulative header frame.

The removable header portion 204 of the top connector assembly 201, includes a stacking connector housing 226. The stacking connector housing 226, best seen in the sectioned view of FIG. 9d, receives ends of the contacts 218 of the header frame 216 on the top connector assembly 201, and maintains them in alignment for engagement with a stacking board connector 228 (or with interconnections on a substrate or PCB). The stacking board connector 228 has surface mount contacts 230 for interconnection with electrical contacts on a printed circuit board (PCB). The surface mount contacts 230 in this illustrative embodiment have opposing ends 232 which engage the ends of contacts 218 of the header frame or assembly 216. It should be noted that the board stacking connector 228 in a preferred embodiment is configured so as to be manipulated by pick and place or other automated assembly equipment. The bottom connector assembly 201' is mounted directly to the substrate or PCB via surface mount leads 233 or alternative interconnection means such as through-hole or compression contacts.

A connector according to the invention can be implemented as a single, unstacked connector, wherein interconnection to a PCB or substrate is done in much the same manner as illustrated with respect to the bottom connector assembly in FIG. 9d. It should be noted that a single connector implementation is connected directly to the PCB or substrate, e.g. via surface mount or through-hole connections, without any stacking connector housing or stacking board connector.

Figure 10A:
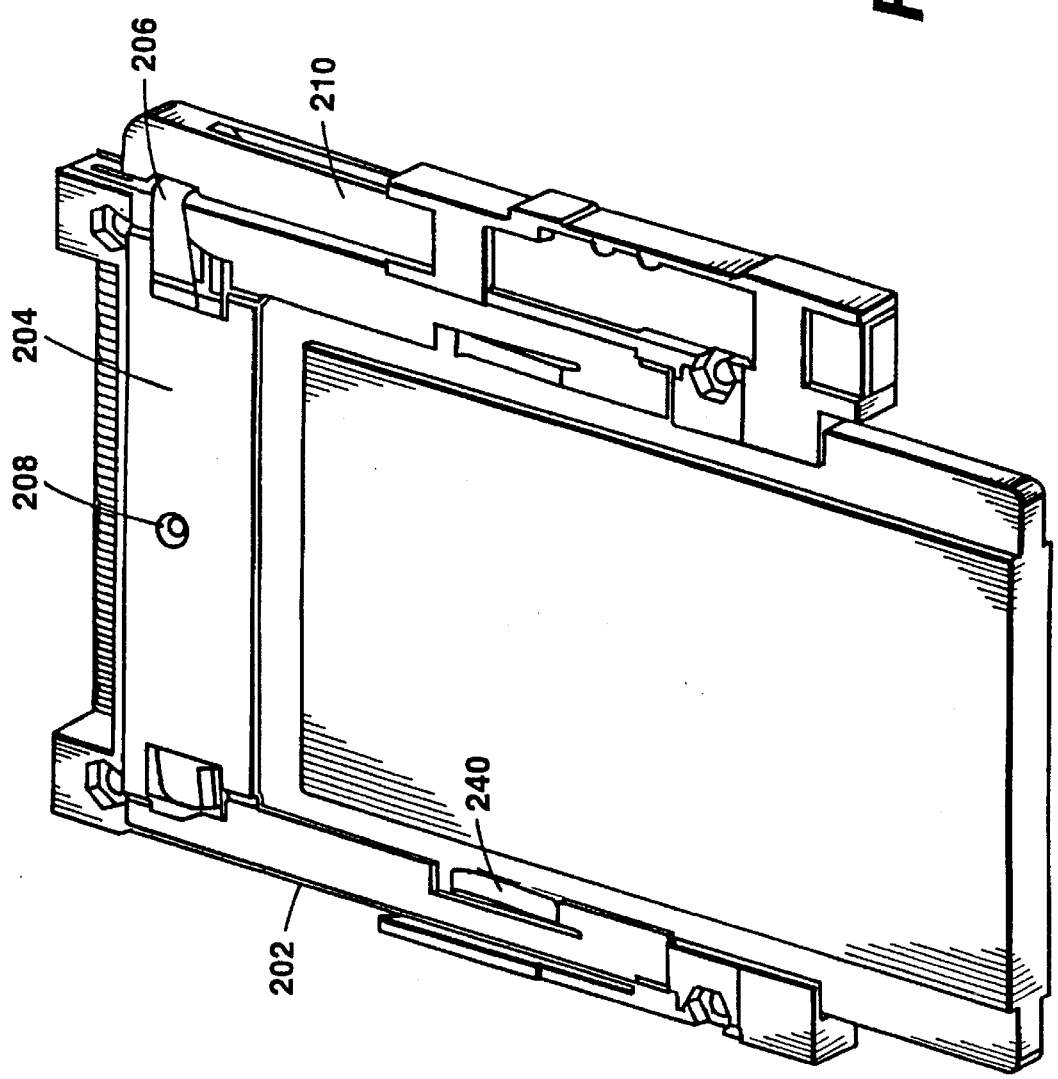
FIG. 10a is a perspective view of a single connector implementation of the dual stackable connector of FIG. 9.
Figure 10B:
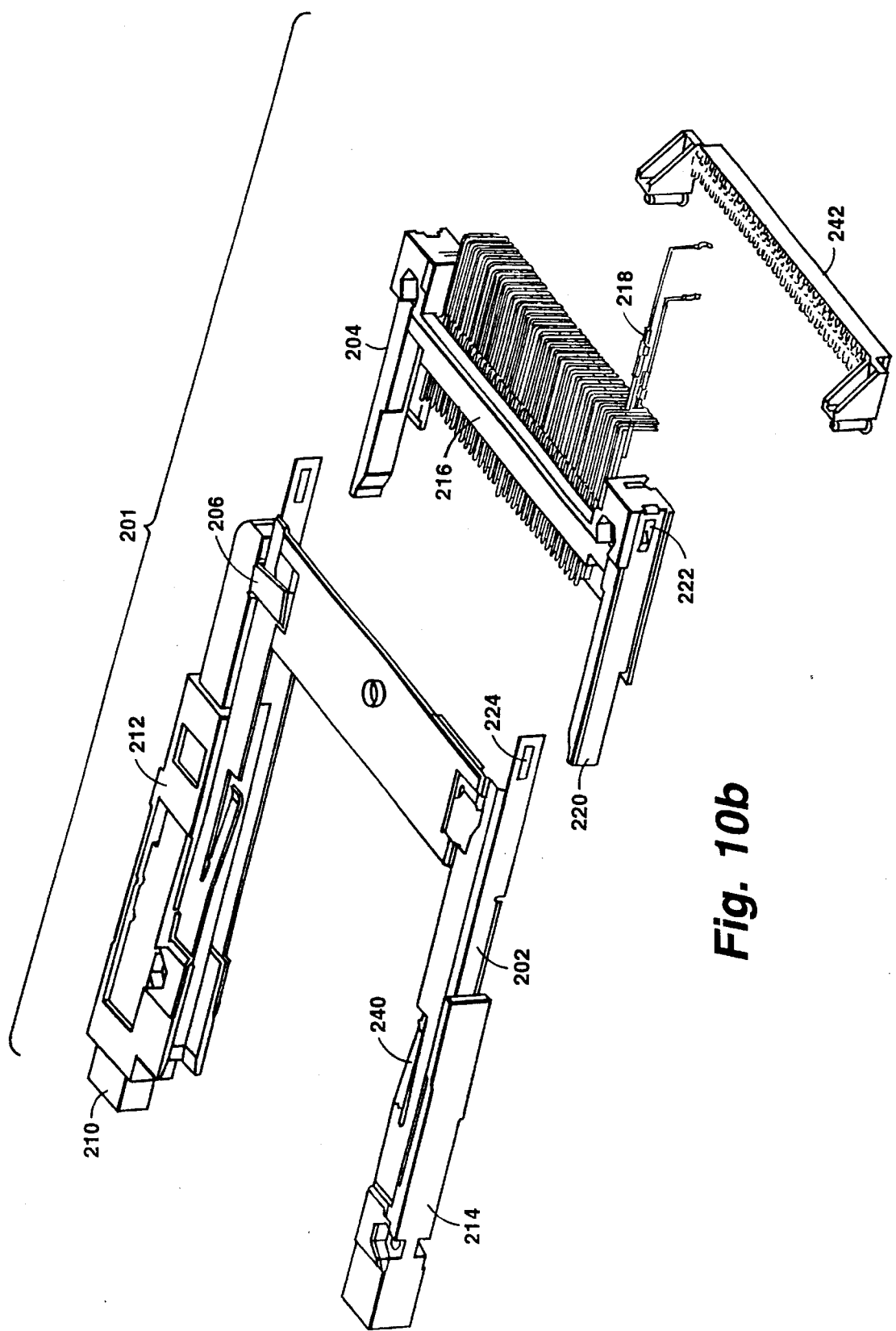

Referring now to FIGS. 10a and 10b, a non-stacked single connector implementation is illustrated, wherein a single connector is configured for mounting on a PCB or substrate. The single connector implementation, like the dual stacked implementation comprises a metallic frame 202 attached to a removable header 204. The metallic frame includes electrostatic discharge (ESD) tabs 240 which contact a portion of an inserted circuit card and eliminate static charge therefrom. In addition to providing inherent ESD removal capabilities, the stamped metallic frame has greater strength to withstand stresses, than known plastic connector implementations. The frame is incorporated into a separable frame assembly including left or right side attachable ejection rail 212 and straight rail 214. The ejection rail 212 has disposed therein the left or right side mountable push arm 210 which is attached to the ejection lever 206. The insulative header frame 216 with contacts 218 disposed therein is attachable to the metallic frame subsequent to the header being processed during subassembly fabrication. The insulative header 216 may be configured as an assembly including a mounting housing 242, similar to the stacking connector housing 226, which assures proper alignment of the contacts 218 for electrical interconnection with the PCB or substrate.

Figure 11A:
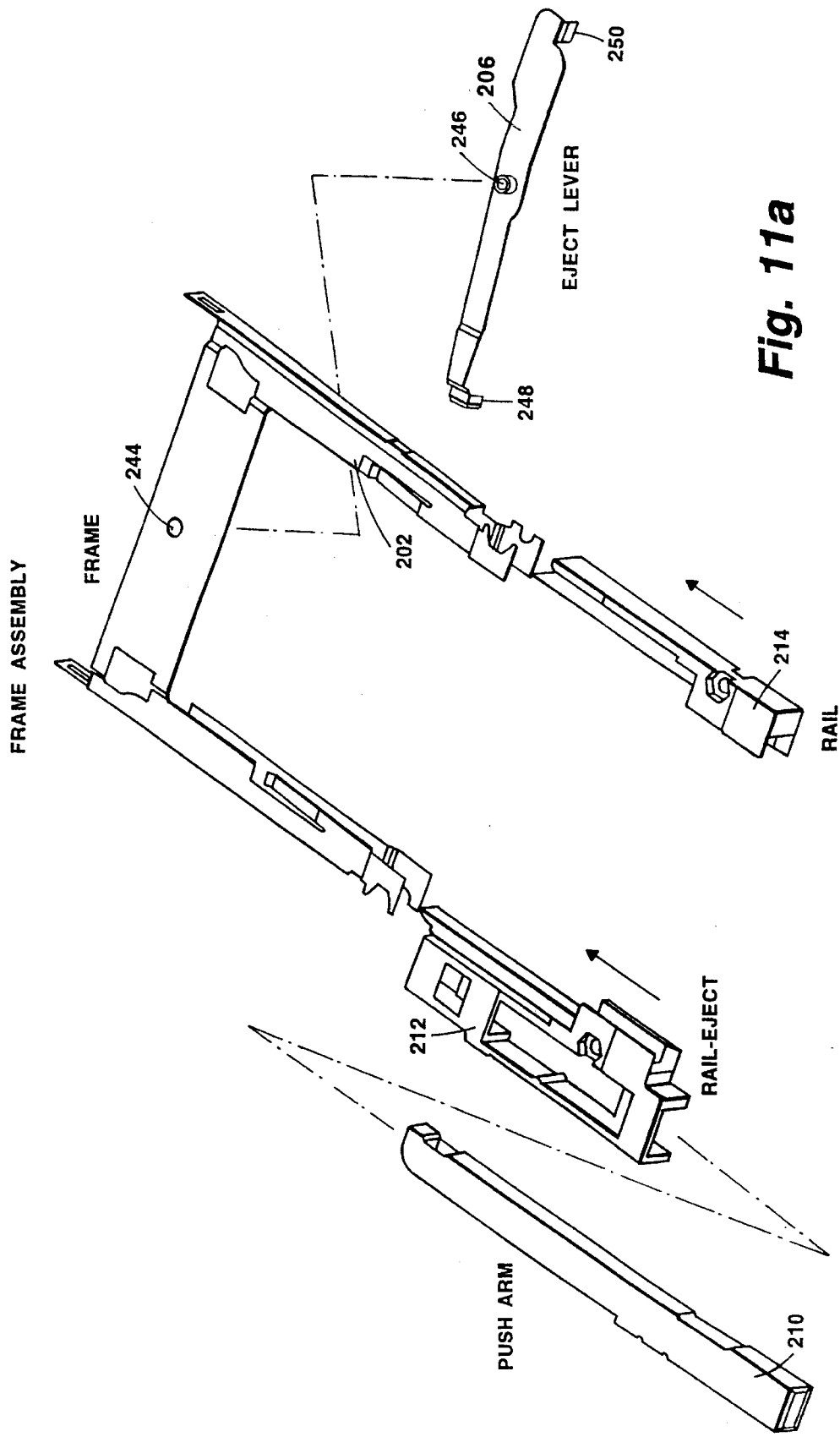
Figure 11B:
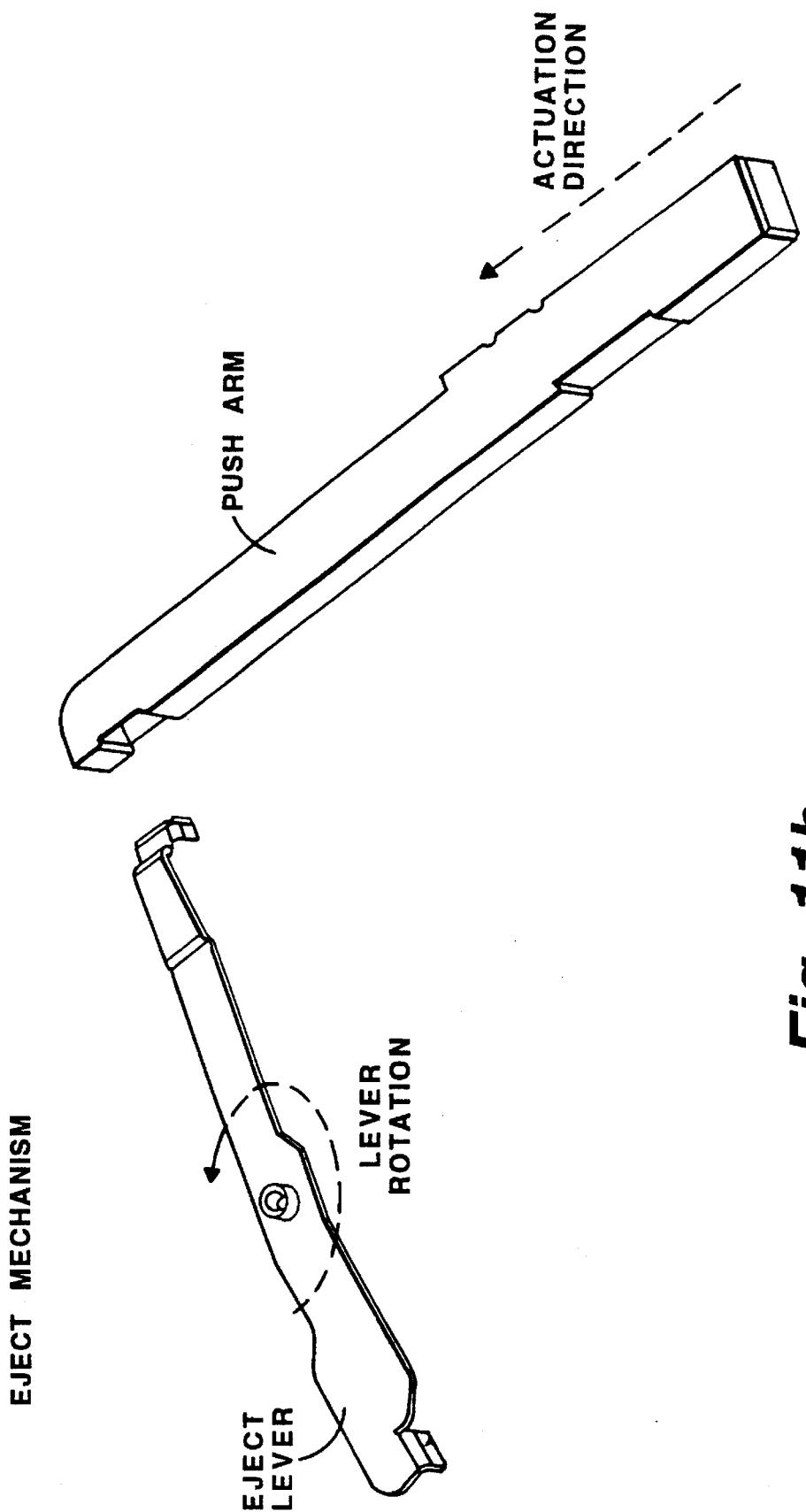

As illustrated in FIGS. 11a and 11b, the frame subassembly according to the invention is designed and fabricated to maximize flexibility and minimize tooling costs in assembling the connector according to the invention. The metallic frame 202 is stamped to be symmetrical about a central hole 244 into which a pivot post portion 246 of the ejection lever 206 is installed. The ejection lever 206 has a first end 248 which is configured to engage the push arm 210 and a second end 250 that includes a circuit card engaging portion which directly engages an inserted circuit card, eliminating the need for force distribution members which are present in known connectors. The push arm snaps into and slidably engages the ejection rail 212, which can be mounted on either the left or right side of the frame 202.

Upon installation of a circuit card into the guides formed by the frame 202, straight rail 214 and ejection rail 212, the push arm 210 is actuated outwardly as the ejection lever 206 is rotated about the pivot post 246. To eject an installed circuit card, the push arm 210 is actuated inwardly, whereupon the ejection lever rotates about the pivot portion acting as a fulcrum point. The circuit card engaging portion of the ejection lever urges the circuit card out of engagement and interconnection with contacts 218 in the header frame 216.

Although in the illustrative stacked embodiment described hereinbefore the upper frame push arm is left side mounted and the lower frame push arm is right side mounted, it should be appreciated that the symmetrical components of the ejection mechanism of the connector according to the invention can be mounted on either side of the symmetrical frame such that the upper frame push arm is right side mounted and the lower frame push arm is left side mounted.

While symmetrical push arm, ejection rail and straight rail components are described herein, non-symmetrical components could be implemented.

Although two rows of contacts are described friction fit into the insulative header frame, it should be appreciated that a greater or lesser number of rows of contacts can be implemented.

While a header frame protuberance and metal frame receptacle are disclosed removably engaging and retaining the removable header to the metallic frame, it will be appreciated that various other engagement features, such as keys and keyways, tangs, latches and the like can be implemented. Although the connector(s) discussed herein include surface mount (SMT) contacts for interconnection with a printed circuit board or substrate, it should be appreciated that alternative interconnections can be implemented such as through-hole or compression interconnections or the like.

While a dual stacking connector is disclosed herein having a stacking connector housing associated with contacts of an upper connector which are aligned for engagement with contacts of a PCB mounted board stacking connector, it should be appreciated that the stacking connector housing associated with contacts of the upper connector and the PCB mounted board stacking connector could be implemented as a single piece, or more, or that the pins of the upper connector could be alternatively aligned for direct mating with the PCB or substrate.

Although single connector and dual stacked connector implementations are described, it should be appreciated that a plurality greater than two can be configured using the connector components according to the invention.

Although the invention has been shown and described with respect to illustrative embodiments thereof, it should be understood by those skilled in the art that the foregoing and various other changes, omissions and additions in the form and detail thereof may be made therein without departing from the spirit and scope of the invention.

What is claimed is:

1. A connector for retaining a circuit card comprising: a first connector assembly including, a frame having a base and a pair of side members, said base having a center mount disposed centrally with respect thereto, said pair of side members dimensioned to receive said circuit card and being symmetrically disposed about said center mount;

a first rail and a second rail each connected to a respective one of said pair of side members, each of said first rail and said second rail configured to be mounted to either of said pair of side members and each having rail portions for slidably receiving said circuit card, one of said first rail and said second rail including a push arm receiving portion;

a separable header assembly having a plurality of contacts disposed therein including a circuit card engaging portion and a substrate interconnection portion, said separable header assembly being removably attachable to said frame; and an ejection mechanism including an ejection lever pivotably mounted to said frame at said center mount and a push arm attached to said ejection lever and configured to be disposed proximate to either of said first rail or said second rail and slidably disposed in said push arm receiving portion.

2. The connector of claim 1, wherein said first connector assembly is an interfacing connector assembly receiving a lower circuit card and interfacing at least one upper circuit card and said lower circuit card to a substrate, said connector further comprising: a second connector assembly receiving said at least one upper circuit card, including, a second connector frame having a second connector base and a second connector pair of side members, said second connector base having a center mount disposed centrally with respect thereto, said second connector pair of side members dimensioned to receive said at least one upper circuit card and being symmetrically disposed about said center mount;

a second connector first rail and a second connector second rail each connected to a respective one of said second connector pair of side members of said second connector frame, said second connector first rail and said second connector second rail configured to be mounted to either of said second connector pair of side members of said second connector frame and each having rail portions for slidably receiving said upper circuit card, one of said second connector first rail and said second connector second rail including a second connector push arm receiving portion;

a second connector separable header assembly having a plurality of second connector contacts disposed therein including a second connector circuit card engaging portion and a first connector assembly interconnection portion engageable with said first connector assembly, said separable header assembly being removably attachable to said frame; and a second connector ejection mechanism including a second connector ejection lever pivotably mounted to said second connector frame at said center mount and a second connector push arm attached to said second connector ejection lever and configured to be disposed proximate to either of said second connector first rail and said second connector second rail and slidably disposed in said second connector push arm receiving portion.

3. The circuit card connector of claim 2, further including a stacking connector portion interfacing said second connector contacts to said substrate, said stacking connector portion including at least a lower housing having a first surface and a second surface, said first surface of said stacking connector portion configured for electrical interconnection with said second connector assembly interconnection portion of said plurality of second connector contacts, and said second surface of said stacking connector portion having contacts for interconnection with electrical contacts on said substrate.

4. The circuit card connector of claim 3, wherein said stacking connector portion further includes at least an upper housing having a first portion engaged with said first connector assembly interconnection portion of said plurality of second connector contacts, and having a second portion engageable with said lower housing.

5. The circuit card connector of claim 1, wherein said frame is constructed of stamped metallic material and at least a portion of said separable header assembly is constructed of an insulative material.

6. The circuit card connector of claim 5, wherein said frame includes a metal latch interconnected with a portion of said separable header assembly.

7. The circuit card connector of claim 1, wherein said push arm receiving portion is included on said first rail and said first rail is connected to a right hand mounted one of said pair of side members.

8. The circuit card connector of claim 1, wherein said push arm receiving portion is included on said first rail and said first rail is connected to a left hand mounted one of said pair of side members.

9. The circuit card connector of claim 2, wherein said second connector push arm receiving portion is included on said second connector first rail and said second connector first rail is connected to a left hand mounted one of said second connector pair of side members.

10. The circuit card connector of claim 2, wherein said second connector push arm receiving portion is included on said second connector first rail and said second connector first rail is connected to a right hand mounted one of said second connector pair of side members.

11. The circuit card connector of claim 2, wherein said push arm receiving portion is included on said first rail and said first rail is connected to a right hand mounted one of said pair of side members and said second connector push arm receiving portion is included on said second connector first rail and said second connector first rail is connected to a left hand mounted one of said second connector pair of side members.

12. The circuit card connector of claim 2, wherein said push arm receiving portion is included on said first rail and said first rail is connected to a left hand mounted one of said pair of side members and said second connector push arm receiving portion is included on said second connector first rail and said second connector first rail is connected to a right hand mounted one of said second connector pair of side members.

* * * * *

UNITED STATES PATENT AND TRADEMARK OFFICE
CERTIFICATE OF CORRECTION

PATENT NO. : 5,492,481
DATED : February 20, 1996
INVENTOR(S) : Mark E. Lewis

It is certified that error appears in the above-indentified patent and that said Letters Patent is hereby corrected as shown below:

Column 7, line 23, "each push and" should read --each push arm--.

Signed and Sealed this

Second Day of September, 1997

Attest:

BRUCE LEHMAN

Attesting Officer

Commissioner of Patents and Trademarks